United States Patent
Wang et al.

(10) Patent No.: US 12,224,385 B2
(45) Date of Patent: Feb. 11, 2025

(54) OPTOELECTRONIC MODULES INCLUDING AN OPTICAL EMITTER AND OPTICAL RECEIVER

(71) Applicant: ams Sensors Singapore Pte. Ltd., Singapore (SG)

(72) Inventors: Ji Wang, Singapore (SG); Qi Chuan Yu, Singapore (SG); Kam Wah Leong, Singapore (SG); Hartmut Rudmann, Jona (CH)

(73) Assignee: AMS SENSORS SINGAPORE PTE. LTD., Singapore (SG)

(*) Notice: Subject to any disclaimer, the term of this patent is extended or adjusted under 35 U.S.C. 154(b) by 692 days.

(21) Appl. No.: 17/297,704

(22) PCT Filed: Dec. 5, 2019

(86) PCT No.: PCT/SG2019/050598
§ 371 (c)(1),
(2) Date: May 27, 2021

(87) PCT Pub. No.: WO2020/130936
PCT Pub. Date: Jun. 25, 2020

(65) Prior Publication Data
US 2022/0045247 A1    Feb. 10, 2022

Related U.S. Application Data

(60) Provisional application No. 62/811,633, filed on Feb. 28, 2019, provisional application No. 62/782,577, filed on Dec. 20, 2018.

(51) Int. Cl.
*H01L 33/56* (2010.01)
*H01L 25/16* (2023.01)
(Continued)

(52) U.S. Cl.
CPC .......... *H01L 33/56* (2013.01); *H01L 25/167* (2013.01); *H01L 31/173* (2013.01); *H01L 33/44* (2013.01);
(Continued)

(58) Field of Classification Search
None
See application file for complete search history.

(56) References Cited

U.S. PATENT DOCUMENTS

2011/0018800 A1* 1/2011 Ahn .................. G06F 1/1616
345/157
2013/0292553 A1* 11/2013 Chang ................ G01J 1/0403
250/216
(Continued)

FOREIGN PATENT DOCUMENTS

CN    105891136 A    8/2016
DE    10 2016 118996 A1    4/2018
(Continued)

OTHER PUBLICATIONS

International Search Report with Written Opinion for related Application No. PCT/SG2019/050598 dated Feb. 18, 2020 (11 Pages).
(Continued)

*Primary Examiner* — William C Trapanese
(74) *Attorney, Agent, or Firm* — VIERING, JENTSCHURA & PARTNER mbB

(57) ABSTRACT

An apparatus includes an optoelectronic module including a light emitting die and a light receiver die mounted on a PCB substrate. The optoelectronic module further includes an optical element on the light emitting die and an optical element on the light receiver die, the optical elements being composed of a first epoxy. A second epoxy laterally surrounds and is in contact with respective side surfaces of the light emitting die, the light receiver die and the optical
(Continued)

elements, wherein the second epoxy provides an optical barrier between the light emitting die and the light receiver die. A method of manufacturing such modules is described as well.

11 Claims, 9 Drawing Sheets

(51) Int. Cl.
*H01L 31/173* (2006.01)
*H01L 33/44* (2010.01)
*H01L 33/58* (2010.01)

(52) U.S. Cl.
CPC ...... *H01L 33/58* (2013.01); *H01L 2933/0025* (2013.01); *H01L 2933/005* (2013.01); *H01L 2933/0058* (2013.01)

(56) References Cited

U.S. PATENT DOCUMENTS

| | | | |
|---|---|---|---|
| 2013/0292706 A1* | 11/2013 | Costello | ........... B05D 1/322 257/82 |
| 2015/0036046 A1* | 2/2015 | Rudmann | ........... G02B 5/22 348/374 |
| 2015/0340265 A1* | 11/2015 | Rudmann | ........... B32B 37/12 156/285 |
| 2016/0238439 A1 | 8/2016 | Chu et al. | |
| 2018/0003927 A1 | 1/2018 | Wu et al. | |
| 2020/0049415 A1* | 2/2020 | Schiffres | ........... F28D 15/046 |

FOREIGN PATENT DOCUMENTS

EP      3 057 138 A1    8/2016
TW      201 347 218 A   11/2013

OTHER PUBLICATIONS

Chinese search report issued for the corresponding Chinese patent application No. 201980084460.8, dated Jun. 17, 2024, 2 pages (for informational purposes only).

* cited by examiner

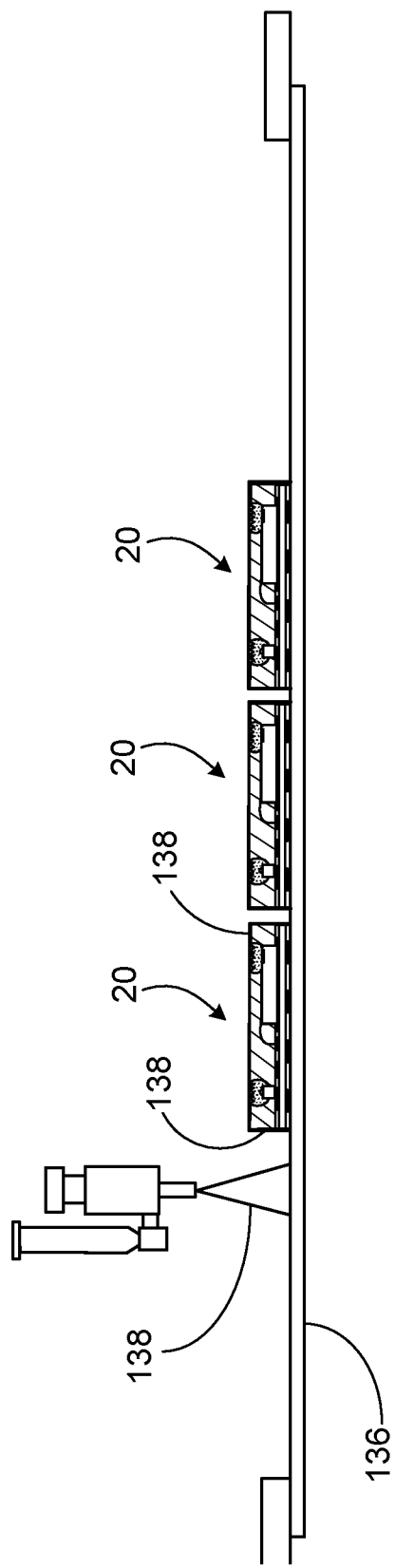

OPTOELECTRONIC MODULES INCLUDING AN OPTICAL EMITTER AND OPTICAL RECEIVER

FIELD OF THE DISCLOSURE

The present disclosure relates to optoelectronic modules including optical emitters and optical receivers.

BACKGROUND

Various consumer electronic products and other host devices include compact optoelectronic modules that have integrated light sensing or light emitting devices. In some instances, space is at a premium in the host devices. Thus, it is desirable to make the modules as small and compact as possible. Further, for modules that include both light emitting and light detecting components, it can be important to provide optical isolation between such components.

SUMMARY

The present disclosure describes optoelectronic modules including optical emitters and optical receivers, and methods of manufacturing such modules.

In one aspect, for example, the present disclosure describes a method including replicating optical elements onto respective surfaces of a plurality of light emitting dies operable to emit light having a wavelength and onto respective surfaces of a plurality of light receiver dies operable to detect light having the wavelength. The optical elements are composed of a first epoxy, and the light emitting dies and light receiver dies are mounted on a PCB wafer attached by a double-sided adhesive tape to a support glass. The method further includes injecting a second epoxy using a vacuum injection molding technique. The second epoxy is substantially opaque to light having the wavelength, and the second epoxy is injected such that it laterally surrounds and is in contact with respective side surfaces of each of the plurality of light emitting dies, each of the plurality of light receiver dies and each of the optical elements. The method includes forming respective trenches in the second epoxy in regions separating duplex pairs of the light emitting dies and the light receiver dies from one another, wherein each duplex pair includes one of the light emitting dies and one of the light receiver dies, and wherein the trenches partially extend into the PCB wafer. The method also includes detaching double-sided adhesive tape and the support glass from the PCB wafer; separating the PCB wafer at locations of the trenches to form singulated modules, and applying an IR coating over at least an exposed surface of one or more of the singulated modules. Each of which includes at least one of the light emitting dies and at least one of the light receiver dies.

Some implementations include one or more of the following features. For example, in some instances, prior to replicating the optical elements and injecting the second epoxy material, a first side of the PCB wafer is attached to a first tape, the first side being opposite that of a second side of the PCB wafer on which the light emitting dies and the light receiver dies are mounted. The method can include using a vacuum chuck to hold the PCB wafer, wherein the vacuum chuck is in contact with the second side of the PCB wafer; subsequently removing the first tape from the PCB wafer; subsequently bringing the first side of the PCB wafer into contact with the double-sided adhesive tape that is attached to the support glass; and subsequently releasing the PCB wafer from the vacuum chuck.

In some implementations, replicating the optical elements includes dispensing the first epoxy selectively onto structured regions of an elastomeric layer, and subsequently pressing the first epoxy onto the light emitting dies and the light receiver dies. In some cases, the optical elements are grid array optical elements.

The method also can include forming additional trenches that extend through the second epoxy and through the PCB wafer, wherein the additional trenches are formed prior to detaching the double-sided adhesive tape and the support glass from the PCB wafer. In some cases, the second epoxy is a black epoxy. In some instances, the double-sided adhesive tape is a heat-releasable double-sided adhesive tape. The method also can include attaching a carrier at an outer surface of the second epoxy after forming the trenches in the second epoxy, and applying heat to remove the double-sided adhesive tape and the support glass from the PCB wafer.

In some cases, the method includes attaching the singulated modules to a heat resistant tape, subsequently applying the IR coating to exposed surfaces of the singulated modules, and removing the singulated modules from the heat resistance tape. Applying the IR coating can include, for example, spraying the IR coating. In some cases, the IR coating is applied to top and side surfaces of the singulated modules. The IR coating can serve as an optical filter to allow only radiation in an IR part of the electromagnetic spectrum to pass.

The present disclosure also describes an apparatus that includes an optoelectronic module including a light emitting die and a light receiver die mounted on a PCB substrate. The optoelectronic module further includes an optical element on the light emitting die and an optical element on the light receiver die, the optical elements being composed of a first epoxy. A second epoxy laterally surrounds and is in contact with respective side surfaces of the light emitting die, the light receiver die and the optical elements, wherein the second epoxy provides an optical barrier between the light emitting die and the light receiver die.

In some instances, the second epoxy substantially fills space between the light emitting die and light receiver die. The second epoxy can be, for example, a black epoxy.

In some implementations, the optical elements are grid array optical elements.

The apparatus also can include a host device that includes a processor and a display screen. The optoelectronic module can be integrated as a component of the host device, wherein the processor is operable to control a component of the host device based, at least in part, on signals from the light receiver die.

The present techniques can, in some instances, simplify the overall manufacturing process and also can result in smaller modules.

Other advantages that are present in some implementations include one or more of the following. Various steps that may be required in other techniques are unnecessary and can be omitted. Further, the present techniques can, in comes cases, help increase wafer density, result in smaller module dimensions, reduce surface seepage incurred by uneven wafer flatness, improve yield due to trench dicing, avoid optical cross-talk and/or enhance light leakage.

Other aspects, features and advantages will be readily apparent from the following detailed description, the accompanying drawings, and the claims.

BRIEF DESCRIPTION OF THE DRAWINGS

FIGS. 10-16 illustrate additional steps in the wafer-level process.

DETAILED DESCRIPTION

The present disclosure describes optoelectronic modules operable to emit light of a particular wavelength (e.g., in the infra-red (IR) part of the spectrum) and to detect light, for example, of the same wavelength. The disclosure also describes wafer-level processes for fabricating multiple modules in parallel at the same time.

Figure 1:
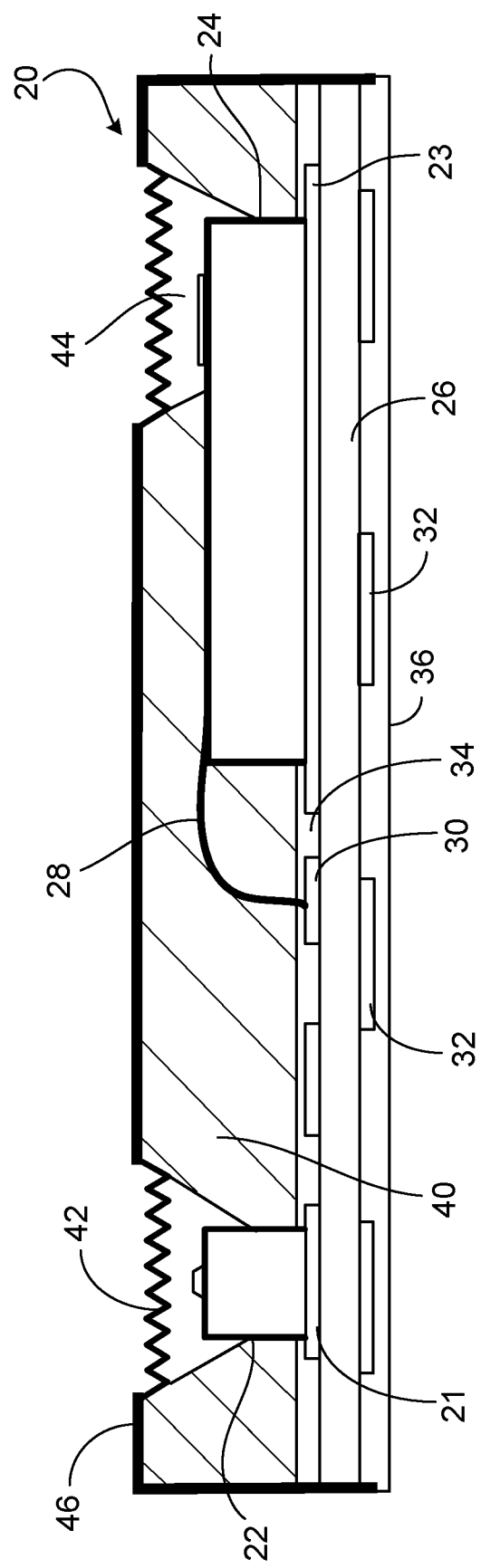
FIG. 1 illustrates an example of an optoelectronic module.

As shown in FIG. 1, an optoelectronic module 20 includes a light source (sometimes referred to as a light emitter) 22 and a light receiver 24 mounted on a support such as a printed circuit board (PCB) substrate 26. The light source 22 can be implemented, for example, as a VCSEL or LED die (i.e., semiconductor chip). Likewise, the light receiver 24 can be implemented, for example, in an integrated circuit die (i.e., semiconductor chip) including a photodiode to detect light and associated processing circuitry.

Electrical contacts on the bottom of each die 22, 24 can be coupled electrically to the PCB substrate 26 by a respective surface mount technology (SMT) contact pad 21, 23. Likewise, electrical contacts on the top of each die 22, 24 can be coupled electrically to the PCB substrate 26 by respective wire bonds 28 that are connected to pads 30. SMT or other electrical contact pads 32 are provided on the bottom surface of the PCB substrate 26. Respective solder masks 34, 36 are provided over the top and bottom surfaces of the PCB substrate 26. For example, a solder mask can be present on the outer, non-active region of the top surface of the PCB substrate.

Black epoxy 40 laterally surrounds the individual semiconductor device dies (e.g., the light source 22 and light receiver 24). In the illustrated example, the epoxy 40 also is in contact with lateral side surfaces of the dies 22, 24. The epoxy 40 preferably is substantially opaque with respect to the wavelength(s) of light emitted by the light source 22 and sensed by the light receiver 24. In the illustrated example, the upper portions of the epoxy 40 also define baffles, part of which laterally surround respective optical elements 42, 44, such as grid optics arrays, disposed on the light emitting and light detecting portions of the dies 22, 24. The black epoxy 40 also is in contact with the lateral side surfaces of the optical elements 42, 44. The black epoxy 40 also serves as an optical barrier that provides optical isolation between the light source 22 and the light receiver 24.

The optical elements 42, 44 can be composed, for example, of a transparent epoxy. In the illustrated example, an IR spray coating 46 is provided over the upper surface of module 20 as well as along its sides. The coating 46 serves as an optical filter that allow only wavelengths of light in the IR region of the spectrum to pass.

FIGS. 2-16 illustrate steps in a wafer-level process for manufacturing multiple modules 20 in parallel. Wafer-level processes can be useful for manufacturing multiple (e.g., tens, hundreds or even thousands) modules in parallel at the same time. The present process allows reflowable materials to be used (i.e., materials that retain their mechanical stability and optical properties even when subjected to elevated temperatures such as 270° C. or above). The process also can provide improved adhesion between different layers.

Figure 2:
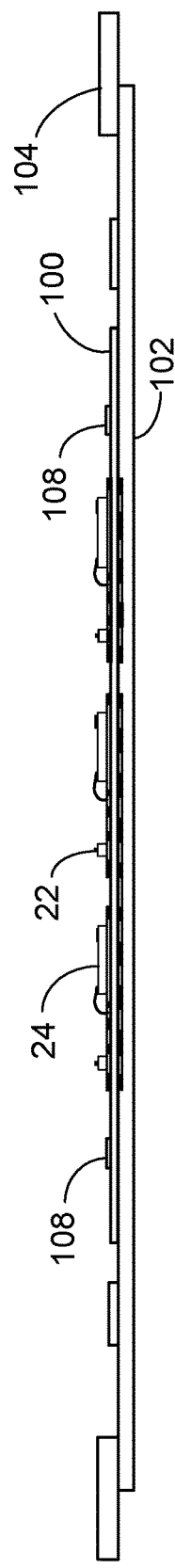
FIGS. 2-8 illustrate various steps in a wafer-level process for fabricating multiple optoelectronic modules.

As shown in FIG. 2, a printed circuit board (PCB) wafer 100 (including electrical contact pads on its upper and lower surfaces) is attached to and supported by a tape 102. Multiple light sources 22 and light receivers 24 are mounted on the PCB wafer 100. In some cases, a wafer frame 104 is present on the tape 102 adjacent the periphery of the PCB wafer 100. Alignment marks 108 can be provided on the PCB wafer 100 to facilitate alignment in subsequent steps.

Figure 3:
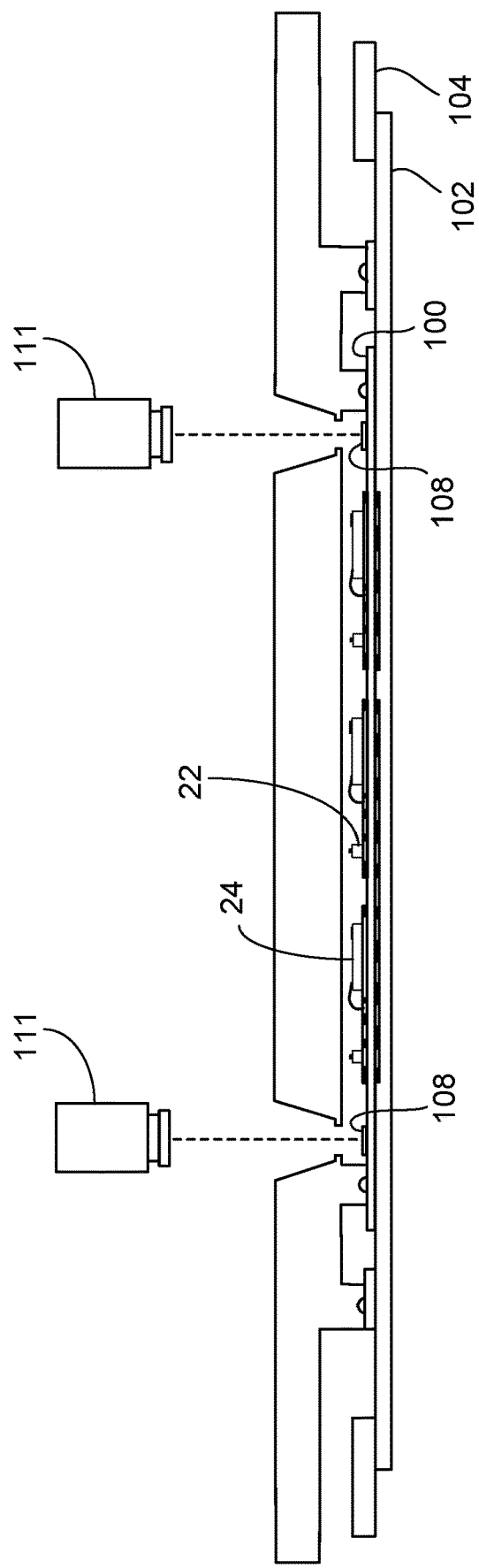
Figure 4:
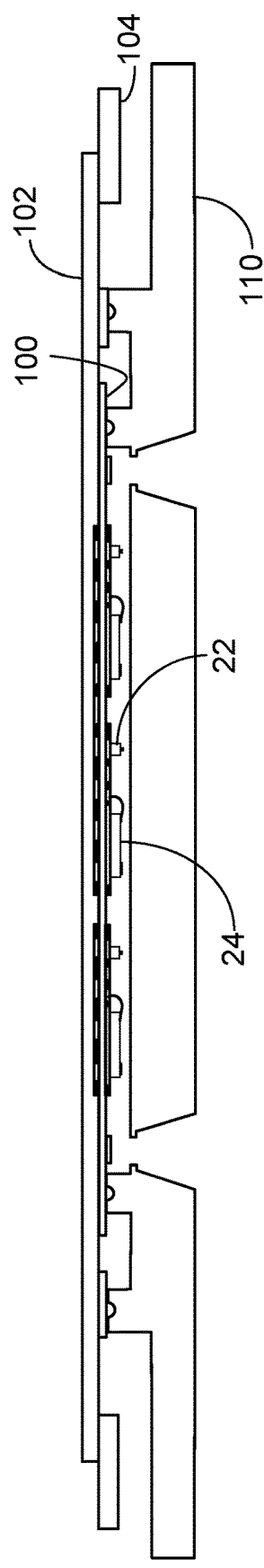

Next, as shown in FIG. 3, a vacuum chuck 110 is aligned and brought into contact with the PCB wafer 100. For this purpose, one or more cameras 111, in conjunction with the alignment marks 108, can be used to determine and confirm proper alignment. A vacuum is applied so as to hold the PCB wafer 100. The entire assembly then is flipped over, as shown in FIG. 4, and the tape 102, as well as the wafer frame 104, is removed.

Figure 5:
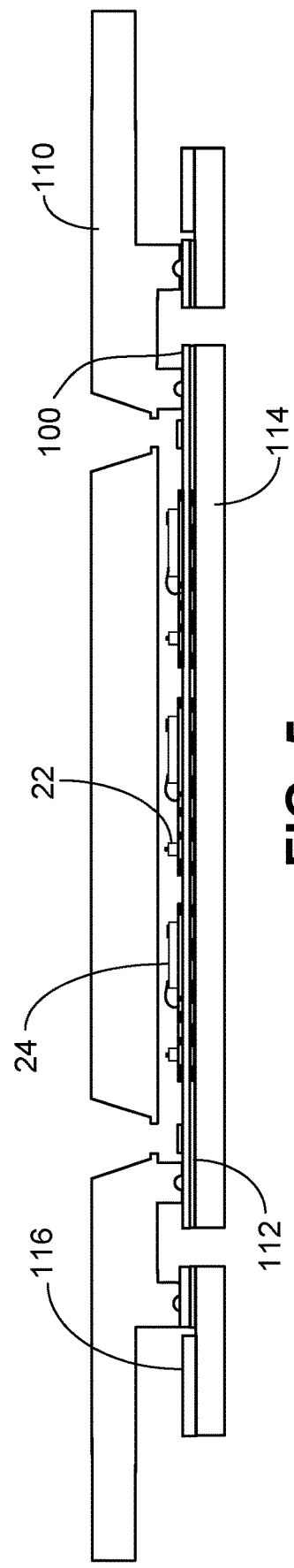

As illustrated by FIG. 5, the assembly is flipped over again while the vacuum chuck 110 holds the PCB wafer 100. The vacuum chuck 110 brings the PCB wafer 100 into contact with one side of heat-releasable double-sided adhesive tape 112, whose opposite side is attached to a bottom injection support glass 114. The support glass 114 helps keep the PCB wafer 100 substantially flat, which can help control the thickness of the subsequently formed vacuum injection molding (VIM) layer. In some instances, a resin spacer 116 is provided on the support glass 114 adjacent the periphery of the PCB substrate 100 and laterally surrounds the periphery of the PCB wafer 100. The spacer 116 can help compensate for the thickness of the PCB wafer 100 and the double-sided adhesive tape 112 during the VIM process (see FIG. 8 below). Once the PCB wafer 100 is attached to the tape 112, the vacuum is stopped, and the vacuum chuck 110 releases the PCB wafer 100.

Figure 6:
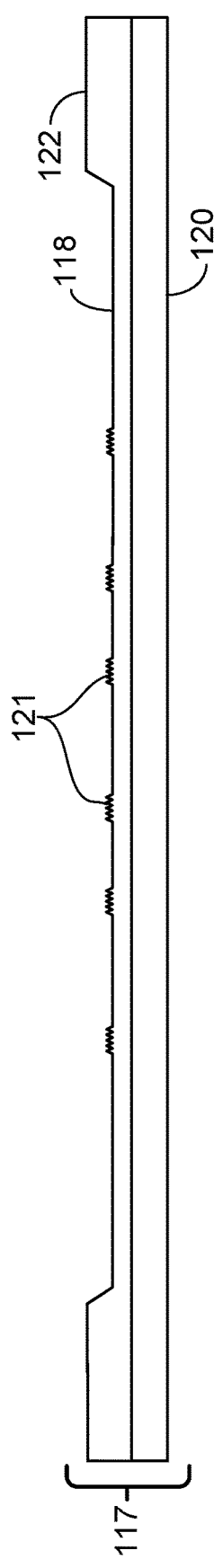

FIG. 6 illustrates an elastomeric (e.g., polydimethylsiloxane (PDMS)) tool 117 used for replication of the optical elements 42, 44 and for the VIM process during which the black epoxy material 40 is injected. As shown in FIG. 6, the PDMS tool 117 includes a structured PDMS layer 118 on a glass lens tool 120. The surface of the PDMS layer 118 can have structured regions 121 that define the shape of the optical elements 42, 44 (e.g., grid array optics). The structured regions 121 may be the same as one another or may differ from one another (e.g., to provide one type of optical element for the light emitters 22 and a different type of optical element for the light receivers 24). The outer periphery 122 of the PDMS layer 118 can be somewhat thicker than the inner region of the PDMS layer so as to provide for thickness control during the subsequent VIM process.

Figure 7:
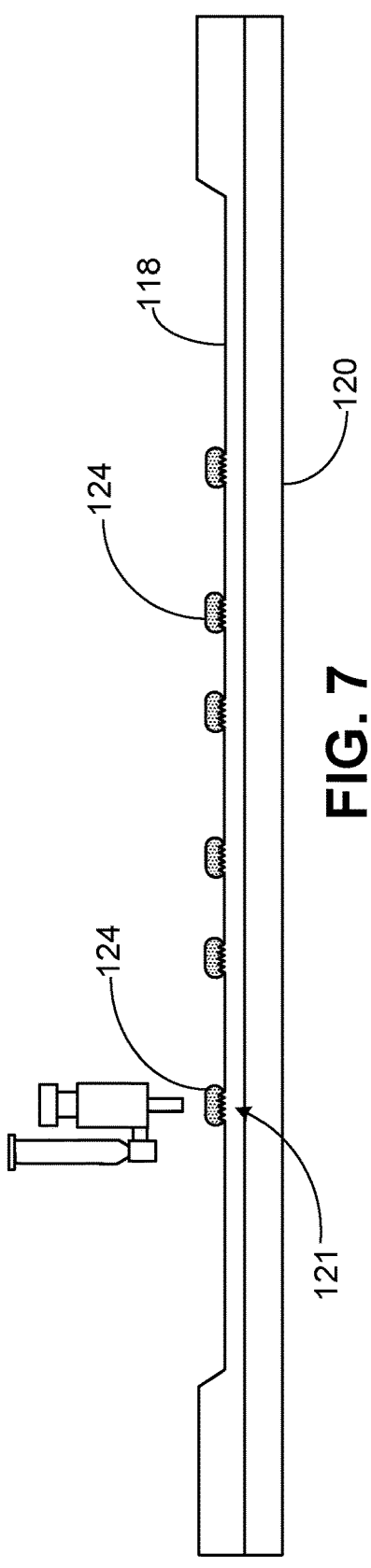

Next, as shown in FIG. 7, a transparent epoxy material 124 is dispensed (e.g., by jetting) onto the structured regions 121 of the PDMS layer 118. In this case, it not necessary to dispense the epoxy material 124 over the entirety of the PDMS layer 118. Instead, the epoxy material 124 can be dispensed selectively onto the structured regions 121, which correspond to the locations where the optical elements 42, 44 are to be replicated.

Figure 8:
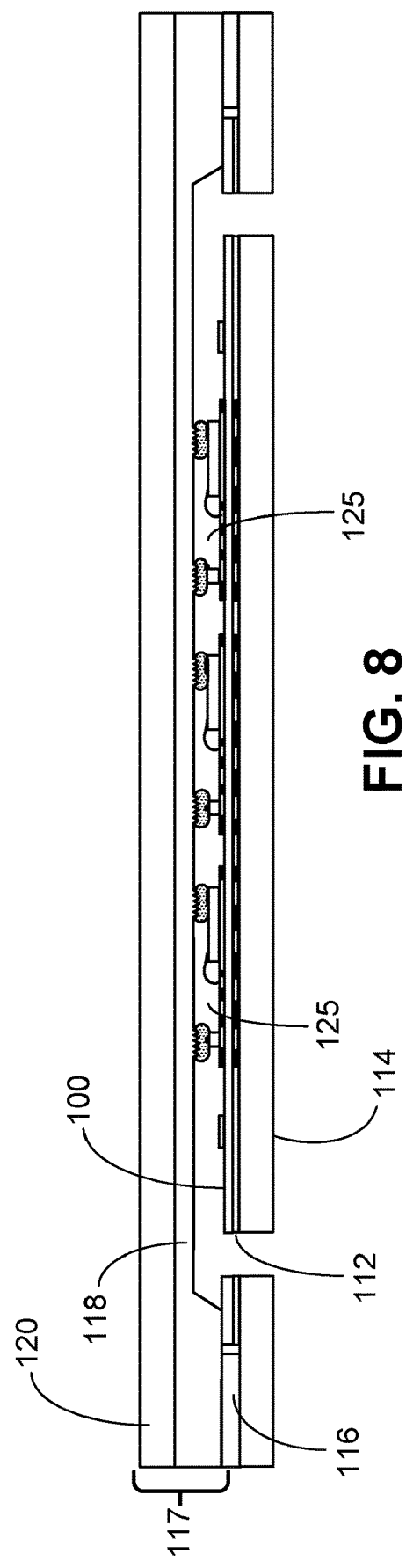

FIG. 8 illustrates a replication process for the optical elements 42, 44. As shown in FIG. 8, the PDMS layer 122 of the PDMS tool is brought into contact with the top surface of the PCB wafer 100 as well as the spacer 116, if present. The upper (PDMS) tool 117 presses the transparent epoxy material 124 against the top surfaces of the light emitters 22 and light receivers 24. The epoxy material 124 then is hardened (e.g., by UV curing). At this stage, spaces 125 with no epoxy remain between the PDMS layer 118 and the PCB wafer 100.

Figure 9:
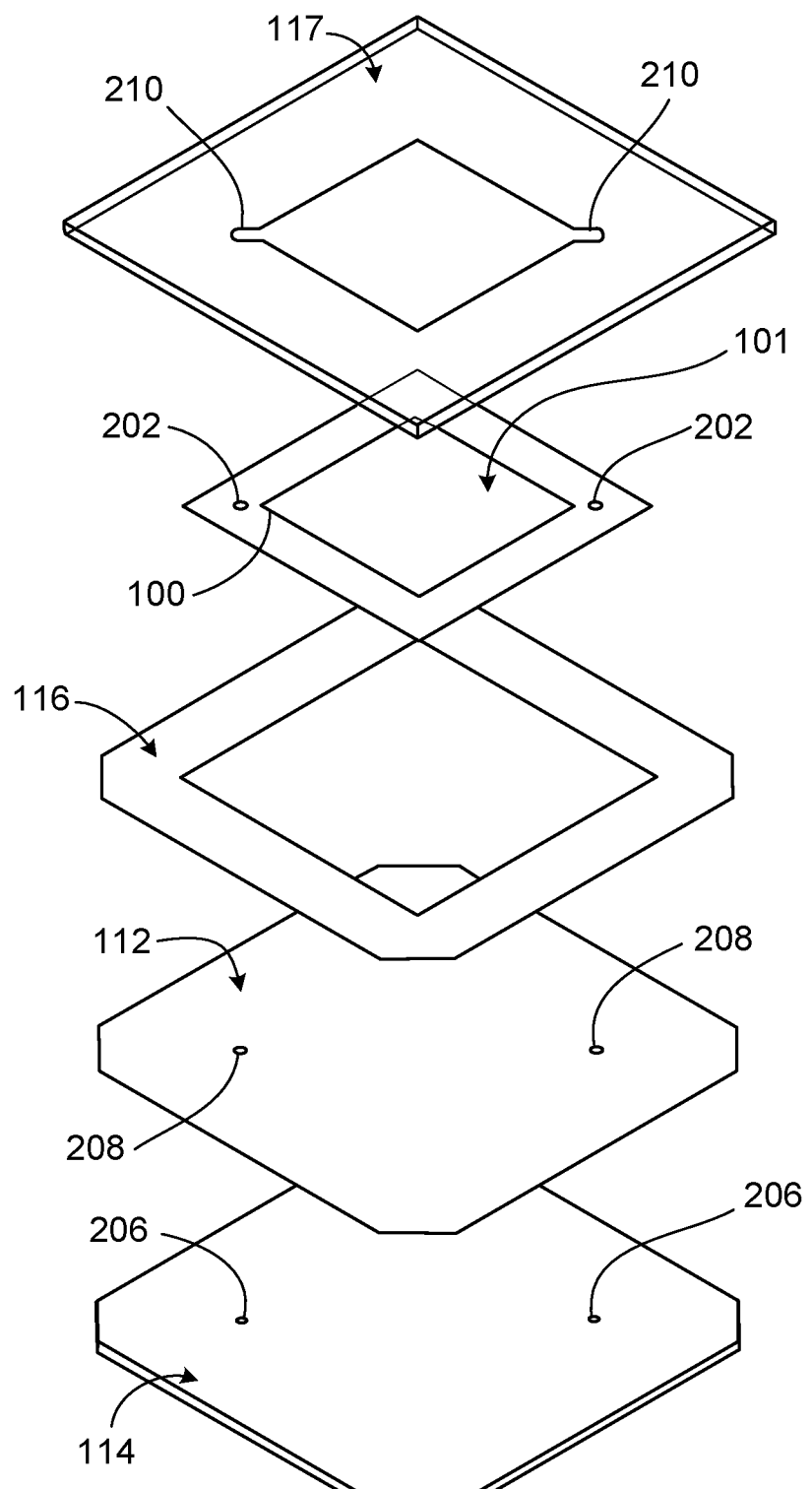
FIG. 9 illustrates further details of aspects of the wafer-level process.

FIG. 9 illustrates further details of the injection support glass 114, the double-sided adhesive tape 112, the spacer 116, the PCB substrate 100 and the upper injection tool 117, respectively, according to some implementations. For example, the PCB substrate 100 can have a square shape including an active area 101. The PCB substrate 100 has holes 202 at opposite corners. The holes 202 serve, respectively, as an inlet and outlet for the flow of epoxy during the VIM process. Some or all of the foregoing details may differ for some implementations.

As further shown in FIG. 9, the bottom injection glass 114 can have a surface that is substantially square-shaped with chamfered corners 204. The e presence of the chamfered corners 204 can be useful in some instances to allow the bottom injection glass 114 to fit into other equipment for subsequent processing (e.g., a dicing machine). The double-sided adhesive tape 112 and the spacer 116, if present, can have outer side dimensions that are about the same as the bottom injection glass 114, and also can have chamfered corners. The bottom injection glass 114 also has holes 206 to provide, respectively, the inlet and outlet for the flow of epoxy during the VIM process and, thus, are aligned with the corresponding holes 202 in the PCB wafer 100. Likewise, the double-sided adhesive tape 112 includes inlet and outlet holes 208 aligned with the foregoing holes 206 of the bottom injection glass 114 and the holes 202 of the PCB wafer 100. Some or all of the foregoing details may differ for some implementations.

As further shown in FIG. 9, the upper PDMS tool 117 can be square-shaped with outer side dimensions the same as the corresponding outer side dimension of the bottom injection glass 114. The upper injection tool 117 can have slots 210 that overlap the positions of the inlet/outlet holes 202 in the PCB wafer 100. Some or all of the foregoing details may differ for some implementations.

Figure 10:
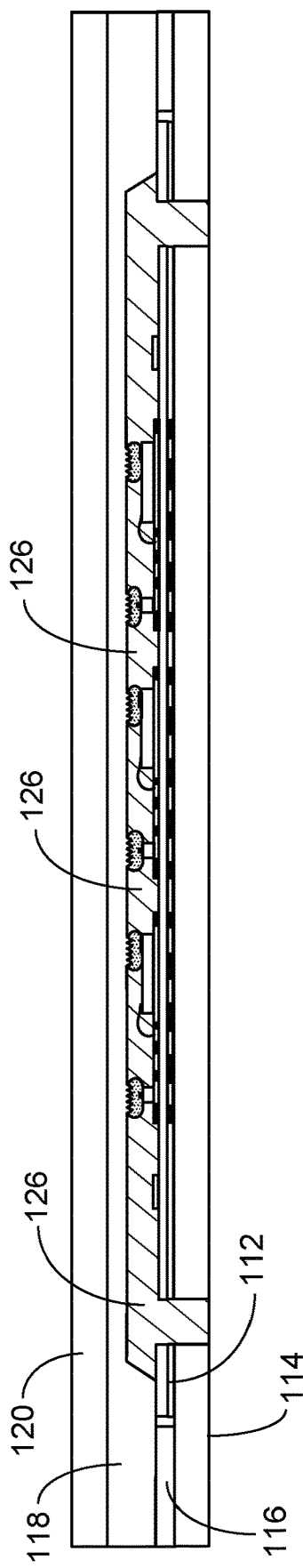

As illustrated in FIG. 10, the VIM process can be performed by injecting a black (or other opaque) epoxy 126 material into the spaces 125 between the PDMS layer 118 and the PCB wafer 100. The epoxy 126 laterally encapsulates the other components, including the light emitters 22 and light receivers 24. The present technique can avoid the need to form trenches, for example, in a transparent epoxy material, followed by filling the trenches with an opaque material to serve as an optical barrier between an emitter 22 and an adjacent receiver 24. Thus, the present techniques can simplify the overall process and also can result in smaller modules. Also, as can be seen in FIG. 10, the spacer 116 provides more uniform (i.e., flat) support and prevents bowing of the PCB wafer 110 during the VIM process.

Following injection of the black epoxy material 126 into the spaces 125, the epoxy material 126 can be hardened, for example, by UV and/or thermal curing. This can be accomplished, in some instances, while the PDMS tool 117 remains in place. After the epoxy material 126 is hardened, the PDMS tool 117 is removed.

Figure 11:
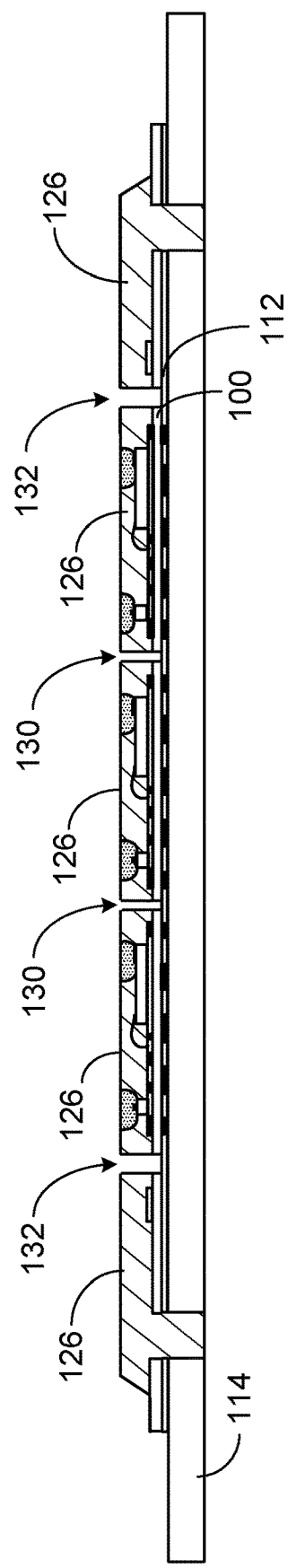

Next, as shown in FIG. 11, narrow vertical trenches 130 are formed through the black epoxy 126. The trenches preferably extend partially into the PCB wafer 100 and serve to release stress. The trenches 130 can be formed, for example, by dicing. In the illustrated example, the trenches 130 separate pairs of a light emitting die 22 and an associated light receiver die 24. Additional, larger trenches 132 can be formed closer to the edge of the PCB wafer 100 and can help during the subsequent release of the of the PCB wafer 100 from the tape 102.

Figure 12:
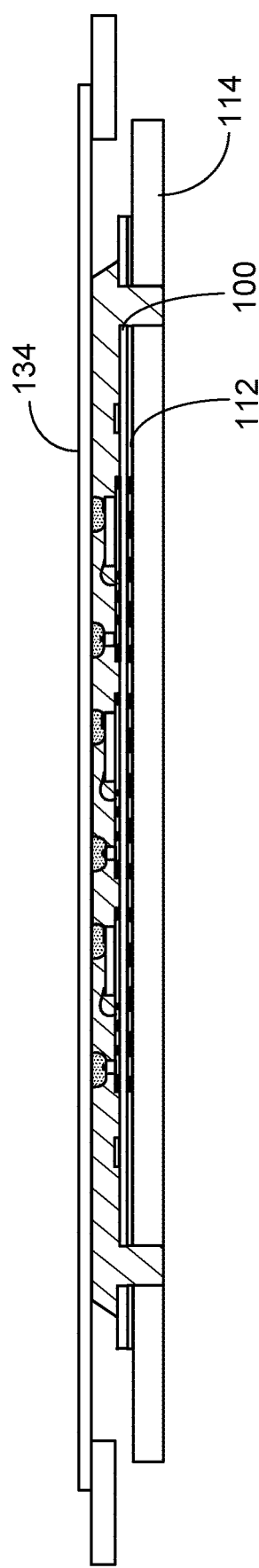
Figure 13:
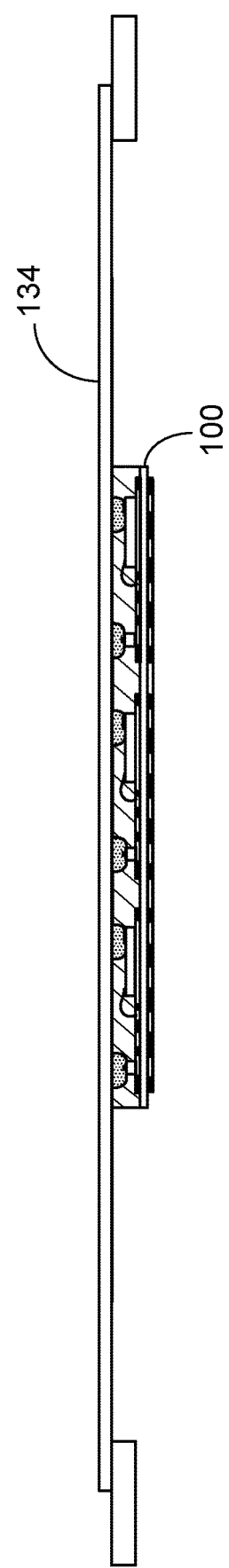
Figure 14:
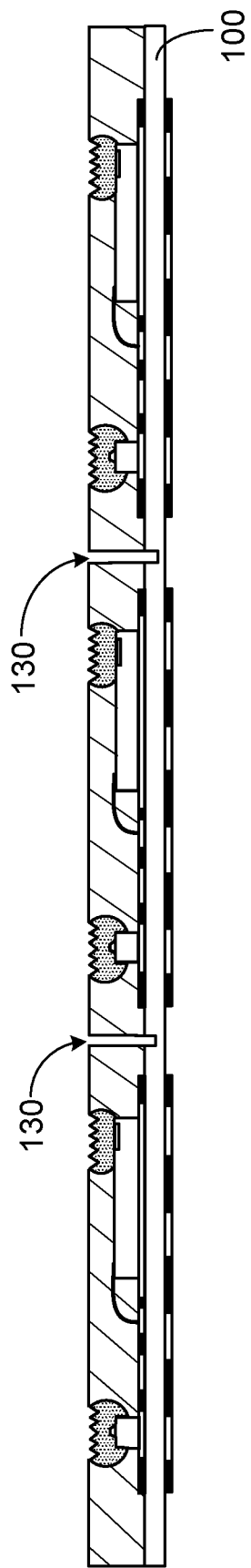
Figure 15:
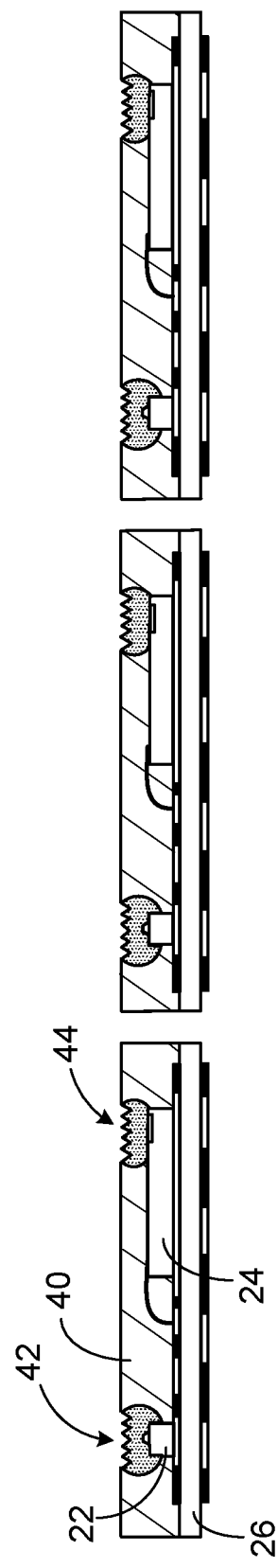

Then, as illustrated in FIG. 12, an intermediate carrier 134 is attached to the top of the assembly (i.e., on the outer surface of the black epoxy 126 and the replicated optical elements 124). Then, as shown in FIG. 13, heat is applied to remove the double-sided adhesive tape 112 as well as the bottom injection support glass 114. The partially separated modules (see FIG. 14) are completely separated from one another during a final singulation process (e.g., dicing) as illustrated by FIG. 15.

Next, as shown in FIG. 16, the modules can be attached to a heat resistant tape 136. The top and side surfaces of the modules then are sprayed with an IR coating 138 that serves as an optical filter to allow only radiation in the IR part of the electromagnetic spectrum to pass. A post-bake process can be applied to cure the IR coating 138 and provide a final thermal cure for other parts of the modules such as the black epoxy 126. The process results in multiple modules, each of which has the features of the module 20 discussed above in connection with FIG. 1. The modules then can be detached from the heat resistant tape 136.

For implementations in which a carrier glass is provided to support the PCB wafer 100, the carrier glass may be recycled readily for repeated use because little or no epoxy contacts the glass (other than, e.g., inlet and outlet holes for the flow of epoxy during the VIM process).

Although the injected epoxy 126 may be referred to as black epoxy, more generally the epoxy 126 preferably is non-transmissive to light of a wavelength sensed by, or emitted by, the optoelectronic devices 22, 24 (e.g., photo-receiver chips or light emitting chips) mounted on the PCB wafer 100.

The modules 20 described here can be integrated into a wide range of portable computing devices, such as smart phones, wearables, bio devices, mobile robots, surveillance cameras, camcorders, laptop computers, and tablet computers, among others. The modules can be useful, for example, as proximity sensor modules or as other optical sensing modules, such as for gesture sensing or recognition.

The design of smart phones and other portable computing devices referenced in this disclosure can include one or more processors, one or more memories (e.g. RAM), storage (e.g., a disk or flash memory), a user interface (which may include, e.g., a keypad, a TFT LCD or OLED display screen, touch or other gesture sensors, a camera or other optical sensor, a compass sensor, a 3D magnetometer, a 3-axis accelerometer, a 3-axis gyroscope, one or more microphones, etc., together with software instructions for providing a graphical user interface), interconnections between these elements (e.g., buses), and an interface for communicating with other devices (which may be wireless, such as GSM, 3G, 4G, CDMA, WiFi, WiMax, Zigbee or Bluetooth, and/or wired, such as through an Ethernet local area network, a T-1 internet connection). In some instances, the one or more processors use signals from the module (e.g., signals from the receiver die 24) to adjust a brightness of the host device's display screen.

Various modifications will be readily apparent and can be made to the foregoing examples. Features described in connection with different embodiments may be incorporated into the same implementation in some cases, and various features described in connection with the foregoing examples may be omitted from some implementations. Thus, other implementations are within the scope of the claims.

What is claimed is:

1. A method comprising:
   replicating optical elements onto respective surfaces of a plurality of light emitting dies operable to emit light having a wavelength and onto respective surfaces of a plurality of light receiver dies operable to detect light having the wavelength, wherein the optical elements are composed of a first epoxy, and wherein the plurality of light emitting dies and the plurality of light receiver dies are mounted on a PCB wafer attached by a double-sided adhesive tape to a support glass;
   injecting a second epoxy using a vacuum injection molding technique, wherein the second epoxy is substantially opaque to light having the wavelength, and wherein the second epoxy is injected such that it laterally surrounds and is in contact with respective side surfaces of each of the plurality of light emitting dies, each of the plurality of light receiver dies and each of the optical elements;
   forming respective trenches in the second epoxy in regions separating duplex pairs of the light emitting dies and the light receiver dies from one another, wherein each duplex pair includes one of the light emitting dies and one of the light receiver dies, and wherein the trenches partially extend into the PCB wafer, and forming additional trenches that extend through the second epoxy and through the PCB wafer, wherein the additional trenches are formed prior to detaching the double-sided adhesive tape and the support glass from the PCB wafer;
   detaching the double-sided adhesive tape and the support glass from the PCB wafer;
   separating the PCB wafer at locations of the trenches to form singulated modules each of which includes at least one of the light emitting dies and at least one of the light receiver dies; and
   applying an IR coating over at least an exposed surface of one or more of the singulated modules, wherein the IR coating serves as an optical filter to allow only radiation in the IR part of the electromagnetic spectrum to pass.

2. The method of claim 1 wherein prior to replicating the optical elements and injecting the second epoxy material, a first side of the PCB wafer is attached to a first tape, the first side being opposite that of a second side of the PCB wafer on which the light emitting dies and the light receiver dies are mounted, the method including:
   using a vacuum chuck to hold the PCB wafer, wherein the vacuum chuck is in contact with the second side of the PCB wafer;
   subsequently removing the first tape from the PCB wafer;
   subsequently bringing the first side of the PCB wafer into contact with the double-sided adhesive tape that is attached to the support glass; and
   subsequently releasing the PCB wafer from the vacuum chuck.

3. The method of claim 1 wherein replicating the optical elements includes: dispensing the first epoxy selectively onto structured regions of an elastomeric layer; and subsequently pressing the first epoxy onto the light emitting dies and the light receiver dies.

4. The method of claim 1 wherein the optical elements are grid array optical elements.

5. The method of claim 1 wherein the second epoxy is a black epoxy.

6. The method of claim 1 wherein the double-sided adhesive tape is a heat-releasable double-sided adhesive tape.

7. The method of claim 6 further including:
   attaching a carrier at an outer surface of the second epoxy after forming the trenches in the second epoxy; and
   applying heat to remove the double-sided adhesive tape and the support glass from the PCB wafer.

8. The method of claim 1 including:
   attaching the singulated modules to a heat resistant tape;
   subsequently applying the IR coating to exposed surfaces of the singulated modules; and
   removing the singulated modules from the heat resistance tape.

9. The method of claim 1 wherein applying the IR coating includes spraying the IR coating.

10. The method of claim 1 wherein the IR coating is applied to top and side surfaces of the singulated modules.

11. The method of claim 1 wherein the IR coating serves as an optical filter to allow only radiation in an IR part of the electromagnetic spectrum to pass.

* * * * *